(12) United States Patent
Swerts et al.

(10) Patent No.: US 7,629,270 B2
(45) Date of Patent: Dec. 8, 2009

(54) REMOTE PLASMA ACTIVATED NITRIDATION

(75) Inventors: Johan Swerts, Keesel-lo (BE); Hilde De Witte, Thisnes (BE); Jan Willem Maes, Wilrijk (BE); Christophe F. Pomarede, Phoenix, AZ (US); Ruben Haverkort, Amersfoort (NL); Yuet Mei Wan, Mount Waverley (AU); Marinus J. De Blank, Heverlee (BE); Cornelius A. Van Der Jeugd, Heverlee (BE); Jacobus Johannes Beulens, Scottsdale, AZ (US)

(73) Assignee: ASM America, Inc., Phoenix, AZ (US)

( * ) Notice: Subject to any disclaimer, the term of this patent is extended or adjusted under 35 U.S.C. 154(b) by 468 days.

(21) Appl. No.: 11/212,503

(22) Filed: Aug. 24, 2005

(65) Prior Publication Data

US 2006/0110943 A1 May 25, 2006

Related U.S. Application Data

(60) Provisional application No. 60/605,068, filed on Aug. 27, 2004.

(51) Int. Cl.
*H01L 21/31* (2006.01)
(52) U.S. Cl. .................. 438/769; 438/771; 438/775; 257/E21.267
(58) Field of Classification Search ............ 438/758, 438/769, 775, 771; 257/E21.267
See application file for complete search history.

(56) References Cited

U.S. PATENT DOCUMENTS 4,363,828 A  12/1982  Brodsky et al.
4,495,218 A  1/1985  Azuma et al.

(Continued)

FOREIGN PATENT DOCUMENTS

EP  0368651 A2  5/1990

(Continued)

OTHER PUBLICATIONS

Kim et al. (Microwave Plasma Chemical Vapor Deposition of Silicon Nitride Films, Journal of the Korean Physical Society, vol. 22, No. 2, Jun. 1889).*

(Continued)

*Primary Examiner*—Brook Kebede
(74) *Attorney, Agent, or Firm*—Knobbe, Martens, Olson & Bear LLP (57) ABSTRACT

A nitrogen precursor that has been activated by exposure to a remotely excited species is used as a reactant to form nitrogen-containing layers. The remotely excited species can be, e.g., $N_2$, Ar, and/or He, which has been excited in a microwave radical generator. Downstream of the microwave radical generator and upstream of the substrate, the flow of excited species is mixed with a flow of $NH_3$. The excited species activates the $NH_3$. The substrate is exposed to both the activated $NH_3$ and the excited species. The substrate can also be exposed to a precursor of another species to form a compound layer in a chemical vapor deposition. In addition, already-deposited layers can be nitrided by exposure to the activated $NH_3$ and to the excited species, which results in higher levels of nitrogen incorporation than plasma nitridation using excited $N_2$ alone, or thermal nitridation using $NH_3$ alone, with the same process temperatures and nitridation durations.

51 Claims, 5 Drawing Sheets

U.S. PATENT DOCUMENTS

| | | | |
|---|---|---|---|
| 4,585,671 A | 4/1986 | Kitagawa et al. |
| 4,684,542 A | 8/1987 | Jasinski et al. |
| 5,214,002 A | 5/1993 | Hayashi et al. |
| 5,227,329 A | 7/1993 | Kobayashi et al. |
| 5,356,673 A | 10/1994 | Schmitt et al. |
| 5,356,821 A | 10/1994 | Naruse et al. |
| 5,389,398 A | 2/1995 | Suzuki et al. |
| 5,389,570 A | 2/1995 | Shiozawa |
| 5,453,858 A | 9/1995 | Yamazaki |
| 5,471,330 A | 11/1995 | Sarma |
| 5,591,494 A | 1/1997 | Sato et al. |
| 5,607,724 A | 3/1997 | Beinglass et al. |
| 5,614,257 A | 3/1997 | Beinglass et al. |
| 5,648,293 A | 7/1997 | Hayama et al. |
| 5,656,531 A | 8/1997 | Thakur et al. |
| 5,695,819 A | 12/1997 | Beinglass et al. |
| 5,698,771 A | 12/1997 | Shields et al. |
| 5,700,520 A | 12/1997 | Beinglass et al. |
| 5,786,027 A | 7/1998 | Rolfson |
| 5,789,030 A | 8/1998 | Rolfson |
| 5,837,580 A | 11/1998 | Thakur et al. |
| 5,849,601 A | 12/1998 | Yamazaki |
| 5,874,129 A | 2/1999 | Beinglass et al. |
| 5,876,797 A | 3/1999 | Beinglass et al. |
| 5,885,869 A | 3/1999 | Turner et al. |
| 5,959,326 A | 9/1999 | Aiso et al. |
| 6,027,705 A | 2/2000 | Kitsuno et al. |
| 6,083,810 A | 7/2000 | Obeng et al. |
| 6,103,600 A | 8/2000 | Ueda et al. |
| 6,159,828 A | 12/2000 | Ping et al. |
| 6,161,498 A | 12/2000 | Toraguchi et al. |
| 6,171,662 B1 | 1/2001 | Nakao |
| 6,197,669 B1 | 3/2001 | Twu et al. |
| 6,197,694 B1 | 3/2001 | Beinglass |
| 6,228,181 B1 | 5/2001 | Yamamoto et al. |
| 6,326,311 B1 | 12/2001 | Ueda et al. |
| 6,385,020 B1 | 5/2002 | Shin et al. |
| 6,455,892 B1 | 9/2002 | Okuno et al. |
| 6,518,203 B2 * | 2/2003 | Narwankar et al. | 438/776 |
| 6,613,695 B2 | 9/2003 | Pomarede et al. |
| 6,809,370 B1 * | 10/2004 | Colombo et al. | 257/310 |
| 6,821,825 B2 | 11/2004 | Todd et al. |
| 6,962,859 B2 | 11/2005 | Todd et al. |
| 2002/0098627 A1 | 7/2002 | Pomarede et al. |
| 2005/0079692 A1 | 4/2005 | Samoilov et al. |
| 2005/0118837 A1 | 6/2005 | Todd et al. |

FOREIGN PATENT DOCUMENTS

| | | |
|---|---|---|
| EP | 0486047 A2 | 5/1992 |
| EP | 0747974 A2 | 12/1996 |
| EP | 1065728 A2 | 1/2001 |
| GB | 2332564 A | 6/1999 |
| JP | 59078919 A | 1/1982 |
| JP | 57209810 A | 12/1982 |
| JP | 59078918 A | 5/1984 |
| JP | 60043485 A | 3/1985 |
| JP | S60-43485 | 3/1985 |
| JP | 61153277 A | 7/1986 |
| JP | 62076612 A | 4/1987 |
| JP | 63003414 A | 1/1988 |
| JP | 63003463 A | 1/1988 |
| JP | 01217956 A | 8/1989 |
| JP | 01268064 A | 10/1989 |
| JP | 02155225 A | 6/1990 |
| JP | H 02-155225 | 6/1990 |
| JP | 03091239 A | 4/1991 |
| JP | H3-91239 | 4/1991 |
| JP | 03185817 A | 8/1991 |
| JP | 03187215 A | 8/1991 |
| JP | H3-185817 | 8/1991 |
| JP | H3-187215 | 8/1991 |
| JP | 03292741 A | 12/1991 |
| JP | 04323834 A | 11/1992 |
| JP | 05021378 A | 1/1993 |
| JP | 05062911 A | 3/1993 |
| JP | H5-62911 | 3/1993 |
| JP | 07249618 A | 9/1995 |
| JP | 08242006 A | 9/1996 |
| JP | 11317530 | 11/1999 |
| WO | WO 02/064853 A2 | 8/2002 |
| WO | WO 2004/009861 A2 | 1/2004 |

OTHER PUBLICATIONS

Ikoma et al., Growth of Si/3C-SiC/Si(100) hetrostructures by pulsed supersonic free jets, Applied Physics Letters, vol. 75, No. 25, pp. 3977-3979, Dec. 1999.

Olivares, J. et al., "Solid-phase crystallization of amorphous SiGe films deposed by LPCVD on SiOs and glass," Thin Solid Films 337 (1999), pp. 51-54.

International Search Report dated Nov. 13, 2003 for international patent application No. PCTUS02/02921, filed on Feb. 1, 2002.

* cited by examiner

REMOTE PLASMA ACTIVATED NITRIDATION

REFERENCE TO RELATED APPLICATIONS

This application claims the priority benefit of U.S. Provisional Application Ser. No. 60/605,068, BATCH SYSTEMS FOR LOW TEMPERATURE SILICON COMPOUND DEPOSITION, filed Aug. 27, 2004.

FIELD OF THE INVENTION

This invention relates generally to integrated circuit fabrication and, more particularly, to methods for incorporating nitrogen into deposited materials.

BACKGROUND OF THE INVENTION

Nitrogen-containing materials, or nitrides, are widely used in the fabrication of integrated circuits. For example, nitrides are used as transistor gate dielectrics, insulators between metal levels, barriers to prevent oxidation and other diffusion, hard masks, passivation layers, spacer materials in transistors, anti-reflective coating materials, layers in non-volatile memories, etc.

To take one example, nitrogen-containing dielectric layers, e.g., silicon dioxide having incorporated nitrogen, are used to form gate dielectrics in many metal-oxide-semiconductor (MOS) transistors. The gate dielectric layer separates a "metal" layer from a semiconductor layer. Typically, the "metal" layer functions as a gate electrode and is formed of silicon, rather than a metal. The silicon is typically doped, e.g., with boron, for increased conductivity. The gate electrode functions to regulate the flow of electrons across the semiconductor layer.

During operation of the transistor, the gate dielectric prevents undesirable electron flow between the semiconductor layer and the gate electrode. The dielectric layer also helps to maintain the long term reliability of the transistor by maintaining the electrical properties of the transistor. For example, the dielectric layer typically prevents dopant diffusion between the gate electrode and the semiconductor layer and typically also resists electrons from being injected into it. Among other things, it will be appreciated that dopant diffusion and/or electron injection can degrade the electrical properties of the transistor by, among other things, altering the threshold voltage needed to control electron flow through the semiconductor layer and by altering the charge-carrying behavior of various layers.

Nitridation of the dielectric layers can improve the thermal and electrical stability of the dielectric layers. Many nitrogen-containing gate dielectric layers, such as high k dielectrics and silicon oxide layers that contain nitrogen, can offer a higher dielectric constant and can offer increased resistance to electron injection. In the addition, nitrogen-containing gate dielectric layers can offer increased resistance to dopant diffusion, relative to similar dielectric layers without nitrogen. Conventional methods of incorporating nitrogen into gate dielectrics can be difficult to control, however, particularly where the gate dielectrics are very thin. Moreover, the amount of incorporated nitrogen may be less than desired in some applications.

Consequently, there is a need for improved methods for incorporating nitrogen to forming nitrogen-containing materials.

SUMMARY OF THE INVENTION

In accordance with one aspect of the invention, a method is provided for semiconductor processing. The method comprises providing a single substrate reaction chamber in gas communication with a source of $NH_3$ and in gas communication with an excited species generator. A semiconductor substrate is provided in the reaction chamber. An excited species is generated in the excited species generator. The $NH_3$ is exposed to the excited species upstream of the substrate and downstream of the excited species generator. The substrate is exposed to the $NH_3$ and the excited species after exposing the $NH_3$ to the excited species.

In accordance with another aspect of the invention, a method is provided for nitriding a surface of a partially fabricated integrated circuit. The method comprises providing the partially fabricated integrated circuit in a reaction chamber. The partially fabricated integrated circuit is nitrided by exposing the partially fabricated integrated circuit to an excited nitrogen species and ammonia, wherein a nitrogen incorporation is greater than about 5%.

In accordance with yet another aspect of the invention, a method is provided for semiconductor processing. The method comprises generating an excited species outside a reaction chamber. The method further comprises generating nitrogen radicals in a reaction chamber by exposing ammonia to the excited species in the chamber.

BRIEF DESCRIPTION OF THE DRAWINGS

The invention will be better understood from the detailed description of the preferred embodiments and from the appended drawings, which are meant to illustrate and not to limit the invention, and wherein like numerals refer to like structures throughout.

DETAILED DESCRIPTION OF THE PREFERRED EMBODIMENTS

Techniques for incorporating nitrogen into deposited materials have been found to exhibit various drawbacks. For example, thermal nitridation with ammonia ($NH_3$) or plasma nitridation with a nitrogen plasma each have shortcomings. Thermal nitridation requires relatively high temperatures to achieve high levels of nitrogen incorporation. These high temperatures, however, can cause unintended reactions with underlying materials. For example, nitridation or oxidation of an underlying layer can occur. In addition, some deposited materials, such as dielectrics forming some gate dielectric layers, can crystallize at high temperatures. Moreover, phase separation in the materials is possible, e.g., ternary oxides can separate into their corresponding binary oxides. The crystallization or phase separation can undesirably alter the physical and electrical properties of the materials and/or of the interfaces of the materials with other materials.

Nitridation can also be accomplished using plasmas, which can be generated in situ or remotely to produce nitrogen radicals. Plasma nitridation can typically be performed at lower temperatures and can offer better control over the nitridation, relative to thermal nitridation. However, in situ plasma nitridation, in which nitrogen radicals are generated in a reaction chamber, can damage the material to be nitrided. Some applications, such as gate dielectric formation, are particularly sensitive to such damage. This damage can be repaired to some extent by an anneal, but the repair undesirably adds to the cost and thermal budget of the nitridation process and, in addition, high temperatures can increase the risk of oxidation, as discussed above for thermal nitridation.

Plasma damage due in situ plasma generation can be avoided by remotely generating the plasma. Remote plasma nitridation, however, has its own set of limitations, due principally to loss radical during travel from the radical generator to a substrate. It will be appreciated that radical loss can occur due to collision of the radicals with reactor surfaces (and the occurrence of collisions can be intensified where the flow dynamics causes recirculation of radicals before the radicals reach the substrate) or with other species in the gas flow, and/or due to recombination with other radicals. In addition, the relatively low temperature of the reaction chamber can also cause radical loss as the energy of the radicals decreases. Moreover, near the substrate, there can be competitive effects in which the hot susceptor area provides additional energy to reduce radical loss, but the presence of the radicals in this volume can increase the occurrence of collisions and lead to further radical loss. The radical loss undesirably limits the efficiency of the nitridation. It will be appreciated that concerns regarding efficiency are exacerbated by the fact that the dissociation efficiency of $N_2$, i.e., the efficiency with which radicals can be generated using $N_2$, is itself limited and is not easily increased.

Radical loss can be mitigated by various measures, none of which completely eliminate the problem. For example, lower process pressures can increase the mean free path between species in a gas flow, thereby reducing the probability that a radical will collide with another radical or other species. The lower pressures can also increase gas speed, allowing the radicals to move more quickly from the radical generator to a substrate, thereby, e.g., minimizing any loss of energy by the radical. The decrease in pressure, however, is constrained by process chamber limitations and operational concerns. For example, plasma chamber safety concerns due to the design of some plasma sources, the need to keep the plasma on and the need to avoid having the plasma extend outside of the plasma source can require that the gas pressure in the chamber be maintained above certain levels. Thus, lowering the gas pressure in the reaction chamber is a limited option in many cases.

In view of these difficulties, preferred embodiments of the invention allow for improved nitridation by exposing a nitrogen species to a remotely-generated excited species and then exposing a substrate to the exposed nitrogen species. The nitrogen species is a stable, non-ionized species when it is exposed to the excited species downstream of an excited species generator and before reaching the surface of a substrate. Preferably, the nitrogen species and the excited species meet in the reaction chamber holding the substrate. The nitrogen species is preferably $NH_3$ and the excited species is preferably an excited nitrogen species generated from $N_2$. Other nonlimiting examples of excited species are excited species generated from He and Ar, for which, advantageously, radical generation can be more efficient than $N_2$. The excited species can be generated in, e.g., a microwave radical generator, positioned upstream of the reaction chamber. In addition, He and Ar can be added with the $N_2$ flow into a radical generator to enhance radical generation and radical lifetimes.

The exposed nitrogen species can advantageously be applied to nitride already deposited materials on the surface of a substrate. In other embodiments, the exposed nitrogen species can be used in any application where nitrogen radicals are desirable. For example, the exposed nitrogen species can be used in the chemical vapor deposition (CVD) of various nitrides. In one example, silicon nitrides can be formed using the exposed nitrogen species as a nitrogen precursor and a silicon species, e.g., trisilane, as a silicon precursor. Moreover, the exposed nitrogen species can be used to form silicon nitride in a cyclic CVD process in which, in each cycle, in sequence: 1) a silicon layer is deposited using the silicon species, 2) the silicon species is removed, and 3) the silicon layer is reacted with the exposed nitrogen species. Multiple cycles can be performed to form a silicon nitride layer of a desired thickness.

Without being limited by theory, it is believed that the excited species, e.g., nitrogen radicals, brings energy to and activates the nitrogen species, e.g., $NH_3$, resulting in an exposed nitrogen species that comprises nitrogen radicals and/or metastable nitrogen species. For example, where $NH_3$ is used as the nitrogen species and nitrogen radicals formed from $N_2$ are used as excited species, $NH_3$ requires less energy for activation than $N_2$, allowing for the generation of additional nitrogen radicals upon activation of the $NH_3$ by exposure to the highly energetic $N_2$-derived radicals and metastable $N_2$. Thus, advantageously, activation of the $NH_3$ by exposure to a remotely generated excited species minimizes the drawbacks, while retaining the benefits, of plasma nitridation. For example, excited species can be used to nitride a material without the plasma damage of in situ plasma nitridation and without the degree of radical loss of nitridation using only a remote plasma. Moreover, relatively low temperatures can be used for the nitridation.

Reference will now be made to the Figures, wherein like numerals refer to like parts throughout.

Preferred Reactor

While the preferred embodiments are presented in the context of a single-substrate, horizontal flow cold-wall reactor, it will be understood that certain aspects of the invention will have application to various types of reactors known in the art and that the invention is not limited to such a single substrate reactor. For example, batch reactors can be used and advantageously allow for increased throughput due to the ability to simultaneously process a plurality of substrates. A suitable batch reactor is available commercially under the trade name A412™ from ASM International, N.V. of The Netherlands.

Nevertheless, use of a single-substrate, horizontal flow cold-wall reactor is particularly advantageous. For example, the illustrated single-pass horizontal flow design enables laminar flow of reactant gases, with low residence times, which in turn facilitates rapid sequential processing, while minimizing the interactions of sequentially flowed reactants with each other and with chamber surfaces. Such a laminar flow enables sequentially flowing reactants that might react with each other. Reactions to be avoided include highly exothermic or explosive reactions, such as produced by oxygen and hydrogen-bearing reactants, and reactions that produce particulate contamination of the chamber. The skilled artisan will recognize, however, that for certain sequential processes, other reactor designs can also be provided for achieving these ends, provided sufficient purge or evacuation times are allowed to remove incompatible reactants.

Figure 1:
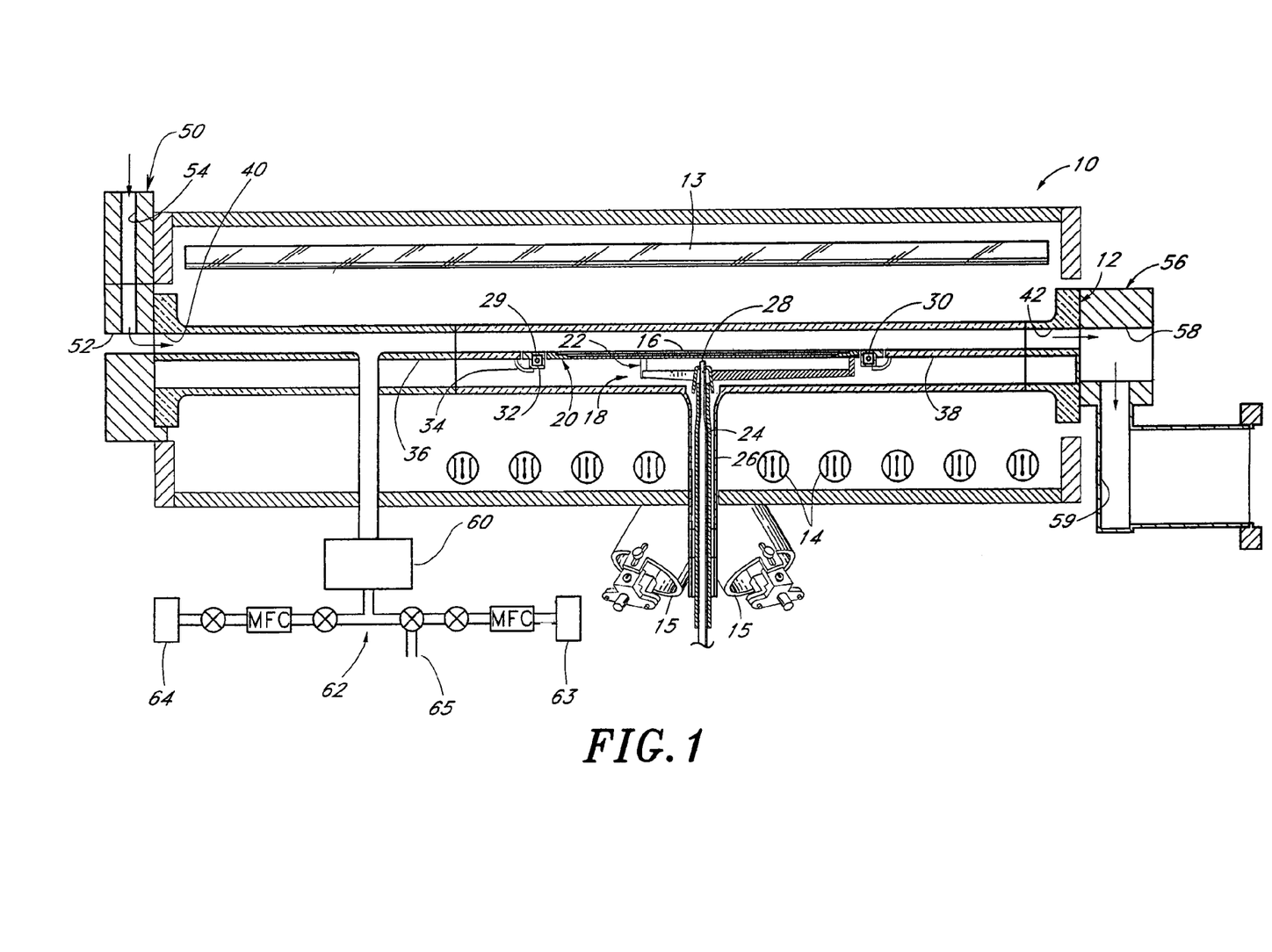
FIG. 1 is a schematic sectional view of an exemplary single-substrate reaction chamber for use with preferred embodiments of the invention.

FIG. 1 shows a chemical vapor deposition (CVD) reactor 10, including a quartz process or reaction chamber 12, constructed in accordance with a preferred embodiment, and for which the methods disclosed herein have particular utility. The superior processing control of the reactor 10 has utility in nitridation and CVD of a number of different materials and can safely and cleanly accomplish multiple treatment steps sequentially in the same chamber 12. The basic configuration of the reactor 10 is available commercially under the trade name Epsilon™ from ASM America, Inc. of Phoenix, AZ.

A plurality of radiant heat sources are supported outside the chamber 12 to provide heat energy in the chamber 12 without appreciable absorption by the quartz chamber 12 walls. The illustrated radiant heat sources comprise an upper heating assembly of elongated tube-type radiant heating elements 13. The upper heating elements 13 are preferably disposed in spaced-apart parallel relationship and also substantially parallel with the reactant gas flow path through the underlying reaction chamber 12. A lower heating assembly comprises similar elongated tube-type radiant heating elements 14 below the reaction chamber 12, preferably oriented transverse to the upper heating elements 13. Desirably, a portion of the radiant heat is diffusely reflected into the chamber 12 by rough specular reflector plates above and below the upper and lower lamps 13, 14, respectively. Additionally, a plurality of spot lamps 15 supply concentrated heat to the underside of the substrate support structure (described below), to counteract a heat sink effect created by cold support structures extending through the bottom of the reaction chamber 12.

Each of the elongated tube type heating elements 13, 14 is preferably a high intensity tungsten filament lamp having a transparent quartz envelope containing a halogen gas, such as iodine. Such lamps produce full-spectrum radiant heat energy transmitted through the walls of the reaction chamber 12 without appreciable absorption. As is known in the art of semiconductor processing equipment, the power of the various lamps 13, 14, 15 can be controlled independently or in grouped zones in response to temperature sensors. The skilled artisan will appreciate, however, that the principles and advantages of the processes described herein can be achieved with other heating and temperature control systems.

A substrate, preferably a silicon wafer 16, is shown supported within the reaction chamber 12 upon a substrate support structure 18. Note that, while the substrate of the illustrated embodiment is a single-crystal silicon wafer, it will be understood that the term "substrate" broadly refers to any surface which is to be nitrided and/or on which a layer is to be deposited. Moreover, nitrided layers are often required on other substrates, including, without limitation, the deposition of optical thin films on glass or other substrates.

The illustrated support structure 18 includes a substrate holder 20, upon which the wafer 16 rests, and which is in turn supported by a support spider 22. The spider 22 is mounted to a shaft 24, which extends downwardly through a tube 26 depending from the chamber lower wall. Preferably, the tube 26 communicates with a source of purge or sweep gas which can flow during processing, inhibiting process gases from escaping to the lower section of the chamber 12.

A plurality of temperature sensors are positioned in proximity to the wafer 16. The temperature sensors can take any of a variety of forms, such as optical pyrometers or thermocouples. The number and positions of the temperature sensors are selected to promote temperature uniformity, as will be understood in light of the description below of the preferred temperature controller. In the illustrated reaction 10, the temperature sensors directly or indirectly sense the temperature of positions in proximity to the wafer.

In the illustrated embodiment, the temperature sensors comprise thermocouples, including a first or central thermocouple 28, suspended below the wafer holder 20 in any suitable fashion. The illustrated central thermocouple 28 passes through the spider 22 in proximity to the wafer holder 20. The reactor 10 further includes a plurality of secondary or peripheral thermocouples, also in proximity to the wafer 16, including a leading edge or front thermocouple 29, a trailing edge or rear thermocouple 30, and a side thermocouple (not shown). Each of the peripheral thermocouples are housed within a slip ring 32, which surrounds the substrate holder 20 and the wafer 16. Each of the central and peripheral thermocouples are connected to a temperature controller, which sets the power of the various heating elements 13, 14, 15 in response to the readings of the thermocouples.

In addition to housing the peripheral thermocouples, the slip ring 32 absorbs and emits radiant heat during high temperature processing, such that it compensates for a tendency toward greater heat loss or absorption at wafer edges, a phenomenon which is known to occur due to a greater ratio of surface area to volume in regions near such edges. By minimizing edge losses, the slip ring 32 can reduce the risk of radial temperature non-uniformities across the wafer 16. The slip ring 32 can be suspended by any suitable means. For example, the illustrated slip ring 32 rests upon elbows 34 which depend from a front chamber divider 36 and a rear chamber divider 38. The dividers 36, 38 desirably are formed of quartz. In some arrangements, the rear divider 38 can be omitted.

The illustrated reaction chamber 12 includes an inlet port 40 for the injection of reactant and carrier gases, and the wafer 16 can also be received therethrough. An outlet port 42 is on the opposite side of the chamber 12, with the wafer support structure 18 positioned between the inlet 40 and outlet 42.

An inlet component 50 is fitted to the reaction chamber 12, adapted to surround the inlet port 40, and includes a horizontally elongated slot 52 through which the wafer 16 can be inserted. A generally vertical inlet 54 receives gases from remote sources, as will be described more fully with respect to FIG. 2, and communicates such gases with the slot 52 and the inlet port 40. The inlet 54 can include gas injectors as described in U.S. Pat. No. 5,221,556, issued Hawkins et al., or as described with respect to FIGS. 21-26 in U.S. patent application Ser. No. 08/637,616, filed Apr. 25, 1996, the disclosures of which are hereby incorporated by reference. Such injectors are designed to maximize uniformity of gas flow for the single-wafer reactor.

Figure 2:
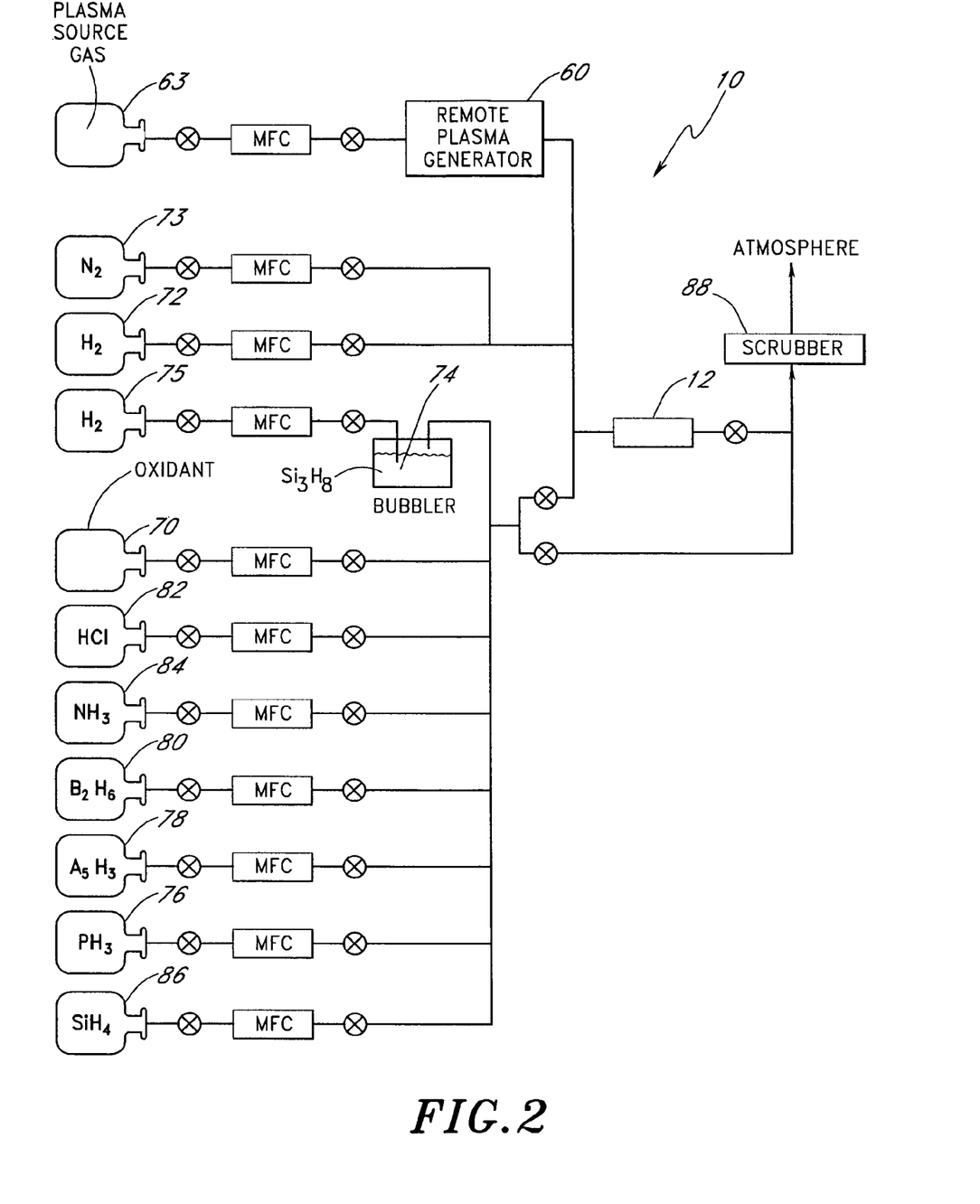
FIG. 2 is a gas flow schematic, illustrating exemplary reactant and inert gas sources in accordance with preferred embodiments of the invention.

An outlet component 56 similarly mounts to the process chamber 12 such that an exhaust opening 58 aligns with the outlet port 42 and leads to exhaust conduits 59. The conduits 59, in turn, can communicate with suitable vacuum means (not shown) for drawing process gases through the chamber 12. In the preferred embodiment, process gases are drawn through the reaction chamber 12 and a downstream scrubber 88 (FIG. 2). A pump or fan is preferably included to aid in drawing process gases through the chamber 12, and to evacuate the chamber for low pressure processing.

The preferred reactor 10 also includes a source 60 of excited species, preferably positioned upstream from the chamber 10. The excited species source 60 of the illustrated embodiment comprises a remote plasma generator, including a magnetron power generator and an applicator along a gas line 62. An exemplary remote plasma generator is available commercially under the trade name TRW-850 from Rapid Reactive Radicals Technology (R3T) GmbH of Munich, Germany. In the illustrated embodiment, microwave energy from a magnetron is coupled to a flowing gas in an applicator along a gas line 62. A source of precursor gases 63 is coupled to the gas line 62 for introduction into the excited species generator 60. The illustrated embodiment employs nitrogen gas as a precursor gas. A separate source of carrier gas 64 can also be coupled to the gas line 62, though in embodiments employing $N_2$ as the nitrogen source, separate carrier gas can be omitted. One or more further branch lines 65 can also be provided for additional reactants. Each gas line can be provided with a separate mass flow controller (MFC) and valves, as shown, to allow selection of relative amounts of carrier and reactant species introduced to the generator 60 and thence into the reaction chamber 12.

Wafers are preferably passed from a handling chamber (not shown), which is isolated from the surrounding environment, through the slot 52 by a pick-up device. The handling chamber and the process chamber 12 are preferably separated by a gate valve (not shown), such as a slit valve with a vertical actuator, or a valve of the type disclosed in U.S. Pat. No. 4,828,224, to Crabb et al., the entire disclosure of which is incorporated by reference herein.

The total volume capacity of a single-wafer process chamber 12 designed for processing 200 mm wafers, for example, is preferably less than about 30 liters, more preferably less than about 20 liters, and most preferably less than about 10. The illustrated chamber 12 has a capacity of about 7.5 liters. Because the illustrated chamber 12 is divided by the dividers 32, 38, wafer holder 20, ring 32, and the purge gas flowing from the tube 26, however, the effective volume through which process gases flow is around half the total volume (about 3.77 liters in the illustrated embodiment). Of course, it will be understood that the volume of the single-wafer process chamber 12 can be different, depending upon the size of the wafers for which the chamber 12 is designed to accommodate. For example, a single-wafer process chamber 12 of the illustrated type, but for 300 mm wafers, preferably has a capacity of less than about 100 liters, more preferably less than about 60 liters, and most preferably less than about 30 liters. One 300 mm wafer process chamber has a total volume of about 24 liters, with an effective processing gas capacity of about 11.83 liters. The relatively small volumes of such chambers desirably allow rapid evacuation or purging of the chamber to allow reactants to be rapidly flowed into the chamber.

FIG. 2 shows a gas line schematic, in accordance with the preferred embodiment. The reactor 10 is provided with a liquid reactant source 74 of trisilane as the preferred silicon source gas or precursor. An inert gas source 75 comprising a gas, preferably $H_2$, for bubbling liquid phase reactants 74 and carrying vapor phase reactants from the bubbler to the reaction chamber 12 is also shown. The bubbler holds liquid trisilane 74 as a silicon source, while a gas line serves to bubble the inert gas through the liquid silicon source and transport the precursors to the reaction chamber 12 in gaseous form.

As also shown in FIG. 2, the reactor 10 further includes a source 72 of hydrogen gas ($H_2$). As is known in the art, hydrogen is a useful carrier gas and purge gas because it can be provided in very high purity, due to its low boiling point, and is compatible with silicon deposition.

The preferred reactor 10 also includes a source 73 of nitrogen gas ($N_2$). As is known in the art, $N_2$ is often employed in place of $H_2$ as a carrier or purge gas in semiconductor fabrication. Nitrogen gas is relatively inert and compatible with many integrated materials and process flows. Other possible carrier gases include noble gases, such as helium (He) or argon (Ar).

In addition, a nitrogen precursor 84, preferably ammonia ($NH_3$), is provided for reaction with deposited layers in the chamber 12. A source 63 of diatomic nitrogen ($N_2$) can be provided as an excited species that is flowed to a remote plasma generator 60 to provide excited species to activate nitrogen species from the nitrogen precursor source 84 and to react with deposited layers in the chamber 12. Moreover, any other suitable excited species source can be used in addition, or as an alternative, to the diatomic nitrogen source 63 to flow through the remote plasma generator 60 to generate excited species to activate the nitrogen precursor the source 84. For example, in other arrangements, the gas source 63 can comprise helium or argon to generate helium and/or argon excited species.

The reactor 10 can also be provided with a source 70 of oxidizing agent or oxidant. The oxidant source 70 can comprise any of a number of known oxidants, particularly a volatile oxidant such as $O_2$, NO, $H_2O$, $N_2O$, HCOOH, $HClO_3$.

Desirably, the reactor 10 will also include other source gases such as dopant sources (e.g., the illustrated phosphine 76, arsine 78 and diborane 80 sources) and etchants for cleaning the reactor walls and other internal components (e.g., HCl source 82 or $NF_3/Cl_2$ [not shown] provided through the excited species generator 60). A source of silane 86 can also be provided, for deposition of silicon layers.

Each of the gas sources can be connected to the inlet 54 (FIG. 1) via gas lines with attendant safety and control valves, as well as mass flow controllers ("MFCs"), which are coordinated at a gas panel. Process gases are communicated to the inlet 54 (FIG. 1) in accordance with directions programmed into a central controller and distributed into the process chamber 12 through injectors. After passing through the process chamber 12, unreacted process gases and gaseous reaction by-products are exhausted to a scrubber 88 to condense environmentally dangerous fumes before exhausting to the atmosphere.

As discussed above, in addition to conventional gas sources, the preferred reactor 10 includes the excited species source 60 positioned remotely or upstream of the reaction chamber 12. The illustrated source 60 couples microwave energy to gas flowing in an applicator, where the gas includes reactant precursors from the reactant source 63. A plasma is ignited within the applicator, and excited species are carried toward the chamber 12. Preferably, of the excited species generated by the source 60, overly reactive ionic species substantially recombine prior to entry into the chamber 12. On the other hand, neutral radicals such as He, Ne, Ar or N radicals, along with metastable stable species, e.g., metastable He, Ne, Ar or $N_2$ species, can survive to enter the chamber 12 and activate the nitrogen precursor and/or react with the substrate.

Process Flow

Figure 3:
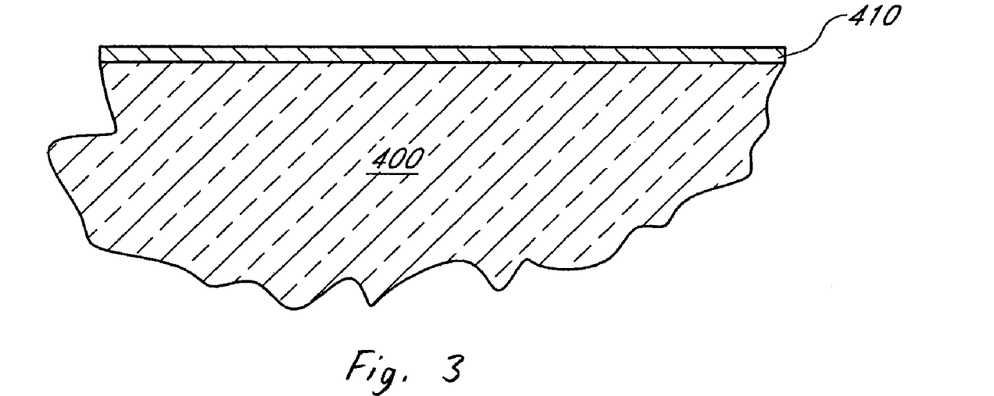
FIG. 3 illustrates a substrate on which a gate dielectric layer is to be formed, in accordance with preferred embodiments of the invention.
Figure 4:
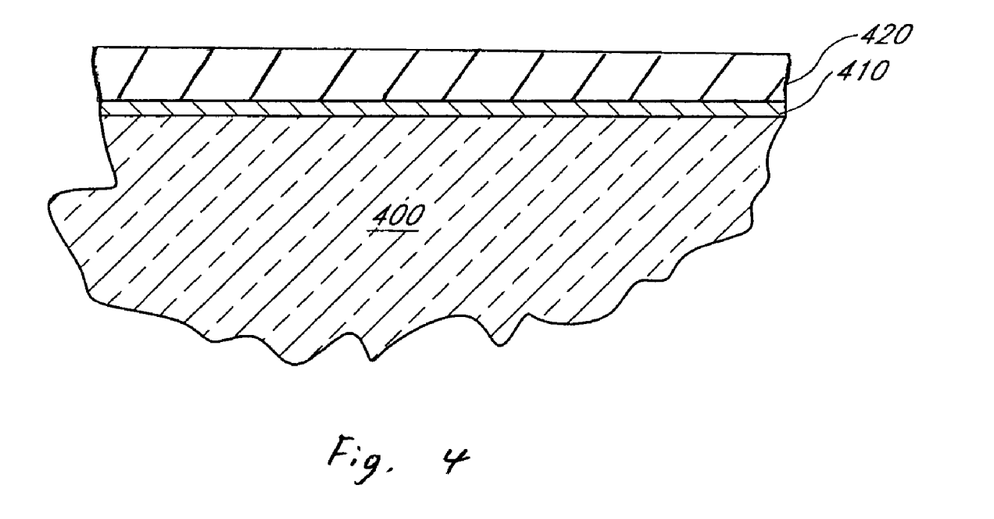
FIG. 4 illustrates the substrate of FIG. 3 after formation of a dielectric layer, in accordance with preferred embodiments of the invention.
Figure 5:
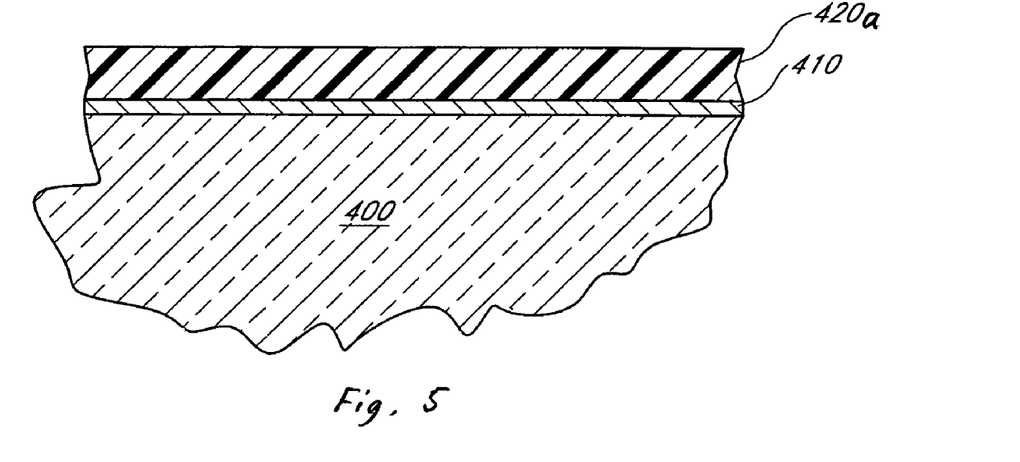
FIG. 5 illustrates the silicon oxide layer of FIG. 4 after nitridation of the dielectric layer, in accordance with preferred embodiments of the invention.

As noted above, the present invention can advantageously be applied to, among other things, nitride gate dielectric layers in, e.g., CMOS (complementary metal oxide semiconductor) transistor applications. FIGS. 3-5 illustrate one possible process sequence for forming such a layer. In the illustrated embodiment, a nitrogen-incorporated gate dielectric layer is formed over a semiconductor structure. It will be appreciated that nitrogen can be incorporated into various layers, e.g., layers of silicon, silicon oxide, hafnium oxide, tantalum oxide, zirconium oxide, lanthanum oxide and silicates, aluminates or alloys thereof to form the gate dielectric layer. Preferably, the layer to be nitrided is a high k dielectric layer comprising, e.g., a metal silicate such as HfSiO. As used herein, a high k dielectric is a dielectric preferably having a k>4.0, more preferably having a k>8 and, most preferably, having a k>10.

With reference to FIG. 3, in preparation for formation of the gate dielectric, a semiconductor wafer 400 is preferably provided in a process chamber with a thin chemical or thermal oxide layer 410, which functions as an interfacial layer and offers improvements in the electrical properties of the ultimately formed electrical devices. The oxide layer 410 can be formed in situ or ex situ. For example, the wafer 400 can be first cleaned to remove contaminants and naturally occurring or native oxide on the semiconductor structure. The cleaning can be accomplished by, e.g., exposing the wafer to HF, in liquid or vapor form. In addition, it will be appreciated that other methods of wafer cleaning, known in the art, are also suitable. A chemical oxide for the interfacial layer 410 can then be formed in a SC-1 step or by exposing the wafer 400 to dilute $O_3$. In other embodiments, a chemical oxide can be formed with an SC1-SC2 or ozonated wafer cleaning.

With reference to FIG. 4, a dielectric layer 420 is formed. The dielectric layer is preferably a high k dielectric and can be formed according to various methods known in the art. For example, where the layer 420 is formed of HfSiO, the layer can be formed by chemical vapor deposition and/or atomic layer deposition using hafnium, silicon and oxide precursors.

In other embodiments where the layer 420 is formed of silicon oxide, the silicon oxide can be formed by various methods, including but not limited to thermal oxidation (using $O_2$ or a mixture of $H_2$ and $O_2$ as the oxygen source) or other methods involving exposing the substrate 400 to oxidant. For example, a crystalline silicon substrate surface, such as Si <100>, can be exposed to atomic oxygen or other known oxidizing chemicals (e.g. water, ozone, oxygen, nitric oxide, nitrous oxide, etc.) to form silicon oxide. In addition, the silicon oxide layer can also be formed by depositing silicon oxide using silicon and oxygen precursors in a chemical vapor deposition. Preferred silicon precursors include polysilanes, i.e., silanes having the chemical formula $Si_nH_{2n+2}$, where n=2 to 4. Preferably, the polysilane is disilane or trisilane. Most preferably, the polysilane is trisilane. Preferred oxygen precursors include those oxidizing agents listed above and can also include oxygen radicals generated using $O_2$.

With reference to FIG. 5, the dielectric layer 420 is nitrided to form nitrided dielectric layer 420a. In the illustrated embodiment, the nitridation is accomplished by flowing $NH_3$ into the reaction chamber 12 through the inlet port 40. In addition, $N_2$ from the gas source 63 is separately flowed into the excited species generator 60 to generate excited species, which can comprise nitrogen radicals or metastable nitrogen species (in the case of $N_2$, the metastable nitrogen species are excited $N_2$ molecules having a high energy level, but insufficient energy or radical formation). The excited species is then flowed from the excited species generator 60 into the chamber 12.

The flow of excited nitrogen species converges with the flow of $NH_3$ upstream of the substrate 16. In the illustrated embodiment, the two gas flows converge via separate inlets to form a merged flow to the substrate 16. The excited species collides with $NH_3$ molecules to activate the $NH_3$. Without being limited by theory, it is believed that the excited species are able to transfer sufficient energy to the $NH_3$ to generate nitrogen radicals from the $NH_3$. It will be appreciated that the energy required for generation of nitrogen radicals from $NH_3$ is less than that for generating nitrogen radicals from $N_2$. Thus, a net gain of nitrogen radicals can be achieved, since nitrogen excited species generated from remotely activated $N_2$ can be used to generate nitrogen radicals from $NH_3$. Moreover, this gain in radicals can be maintained because the activation of the $NH_3$ occurs in the chamber 12, closer to the wafer 16 (FIG. 1), decreasing the opportunity for radical loss due to collisions and recombination of radical species. In addition, a heated wafer can also contribute energy which contributes to the local generation of additional radicals from the $NH_3$/nitrogen excited species mixture near the wafer 16.

With continued reference to FIG. 5, the nitrogen radicals, metastable nitrogen species and $NH_3$ impinge on the dielectric layer 420 (FIG. 4), to form nitrogen-incorporated dielectric layer 420a. It will be appreciated that the duration, temperature and other parameters of the nitridation will depend upon the thickness of the dielectric layer 420 and the degree of nitrogen incorporation desired for the nitrided dielectric layer 420a. For example, the duration and/or temperature of the nitridation can be increased to increase the degree of nitridation.

Optionally, after nitridation, the substrate is annealed to densify and stabilize the resulting films. It will be appreciated that the temperature and duration of the anneal is chosen based upon, e.g., temperature compatibility with particular materials. The substrate can be annealed for, e.g., 1-2 minutes. For example, the substrate can be annealed for about 60 seconds at temperatures of about 700° C. or less for Hf-rich Hf-silicates and temperatures of about 800° C. or less for Si-rich Hf-siliicates.

Figure 6:
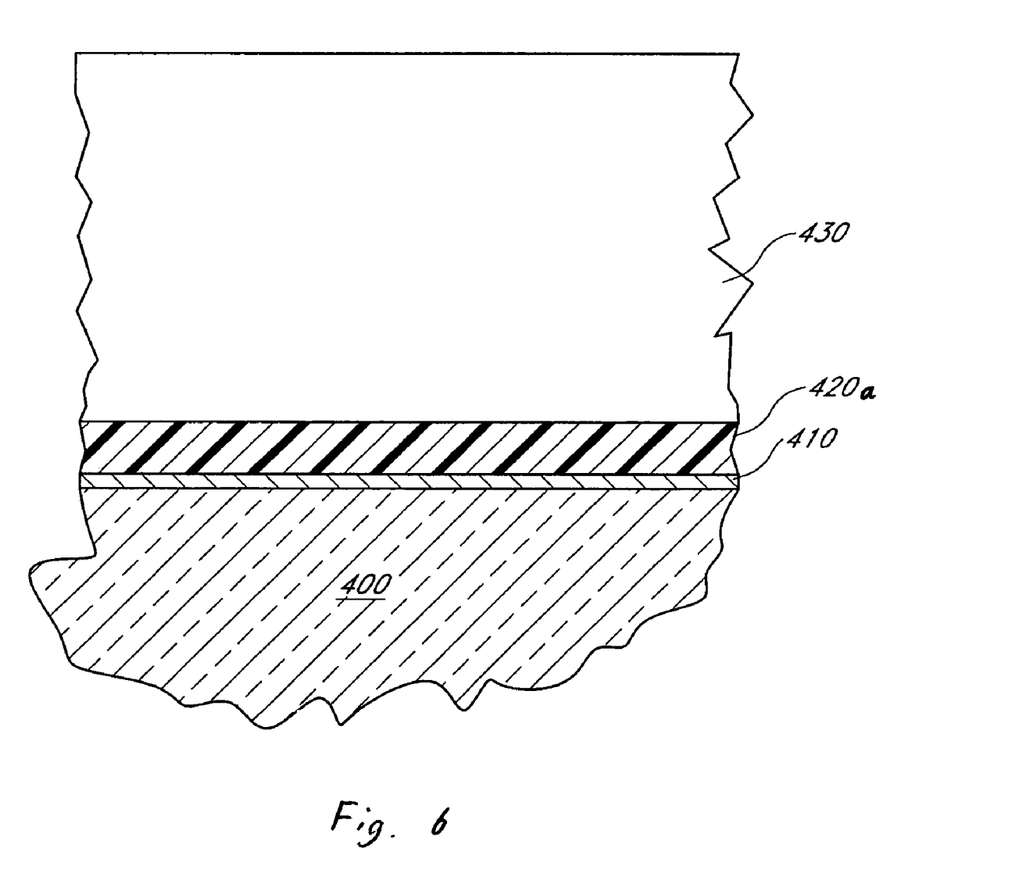
FIG. 6 illustrates a gate electrode formed over the nitrided dielectric layer of FIG. 5, in accordance with preferred embodiments of the invention.

With reference to FIG. 6, after formation of the nitrogen-incorporated dielectric layer 420a, a gate electrode 430 can be formed by various methods known in the art.

EXAMPLE 1

The effect of adding $NH_3$ downstream of a $N_2$ plasma source in a remote plasma enhanced chemical vapor deposition (RPECVD) of a silicon nitride film was investigated. The deposition was performed in a single substrate Epsilon™ reactor from ASM America, Inc. of Phoenix, AZ. A wafer was loaded into the reaction chamber and prepared for silicon nitride deposition. The deposition temperature was set at 650°

C. and the pressure at 2 Torr. Silane ($SiH_4$) was used as the silicon precursor and was flowed into the reaction chamber at 10 sccm. Ammonia was flowed into the reaction chamber at rates that varied from 0-1000 sccm, depending upon the deposition run. Excited nitrogen species, comprising nitrogen radicals and metastable nitrogen species, were generated by flowing nitrogen gas ($N_2$) into a microwave radical generator (MRG) at 4 slm and flowed into the reaction chamber. In depositions where ammonia was flowed into the chamber, the flow of the excited nitrogen species was merged with the flow of the ammonia in the chamber.

Figure 7:
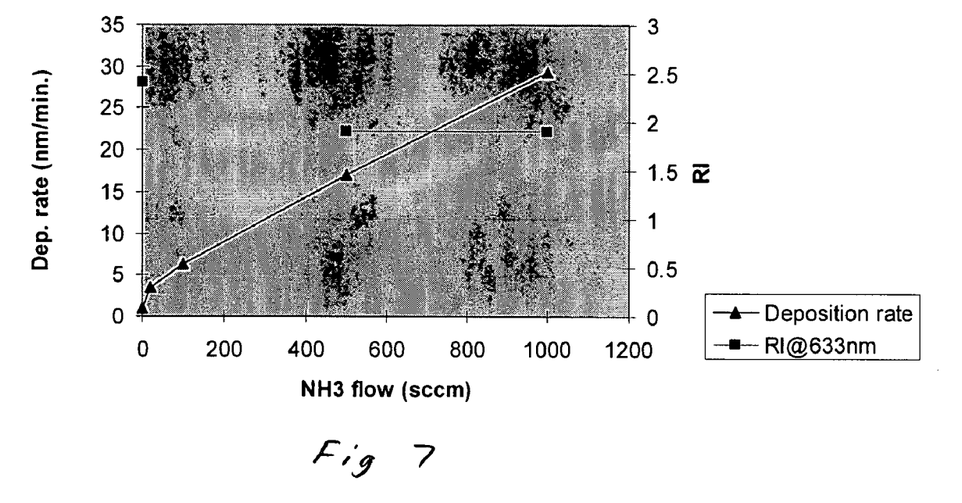
FIG. 7 is a graph showing the deposition rate of a silicon nitride layer formed in accordance with preferred embodiments of the invention.

The deposition rate and the refractive index of the resulting silicon nitride films were determined. With reference to FIG. 7, the deposition rate of the silicon nitride films were found to be greatly enhanced by the addition of $NH_3$ to the reactant flow. For example, the deposition rate increased from about 1 nm/minute without flowing $NH_3$, to about 28 nm/minute with a $NH_3$ flow of 1000 sccm. Thus, the deposition rate unexpectedly increased by an order of magnitude with the $NH_3$ flow. Preferably, the deposition rates for the nitrogen compound films are about 5 nm/minute or more, more preferably, about 10 nm/minute or more and, most preferably, about 20 nm/minute or more.

Also, in separate experiments not illustrated in FIG. 7, it was found that silicon nitride deposition using $NH_3$ and $SiH_4$ resulted in a deposition rate that was even less than that found for silicon nitride deposition using excited nitrogen species alone with $SiH_4$. These experiments indicate that it is synergy from the combination of excited nitrogen species and $NH_3$ which causes the increase in deposition rates; the increase is not the result of the contribution of a single one of these two reactants. Moreover, advantageously, the refractive index of the films formed with and without a $NH_3$ flow were similar, indicating good levels of nitrogen incorporation in the deposited films.

EXAMPLE 2

The effect of adding $NH_3$ downstream of a $N_2$ plasma source to incorporate nitrogen into an already-formed high-k dielectric was investigated. The nitrogen incorporation was performed in a single substrate Epsilon™ reactor from ASM America, Inc. of Phoenix, AZ. Nitrogen was incorporated into a 2 nm HfSiO layer (Hf:Si pulse ratio of 1:1) in various post deposition anneals.

Depositions by thermal nitridation at a temperature of 700° C. using $NH_3$ were used as a reference. The partial pressure of the $NH_3$ was varied from about 0.05 to about 1.2 Torr.

In other experiments, remotely excited nitrogen species derived from $N_2$ were flowed into the reaction chamber along with a flow of $NH_3$. The nitridation temperature was set at 600° C. The pressure was held constant at 2.5 Torr. Excited nitrogen species were generated by flowing nitrogen gas into a microwave radical generator (MRG) at 16 slm. Ammonia was flowed into the reaction chamber at rates varying from 0.2 slm to 2 slm.

Figure 8:
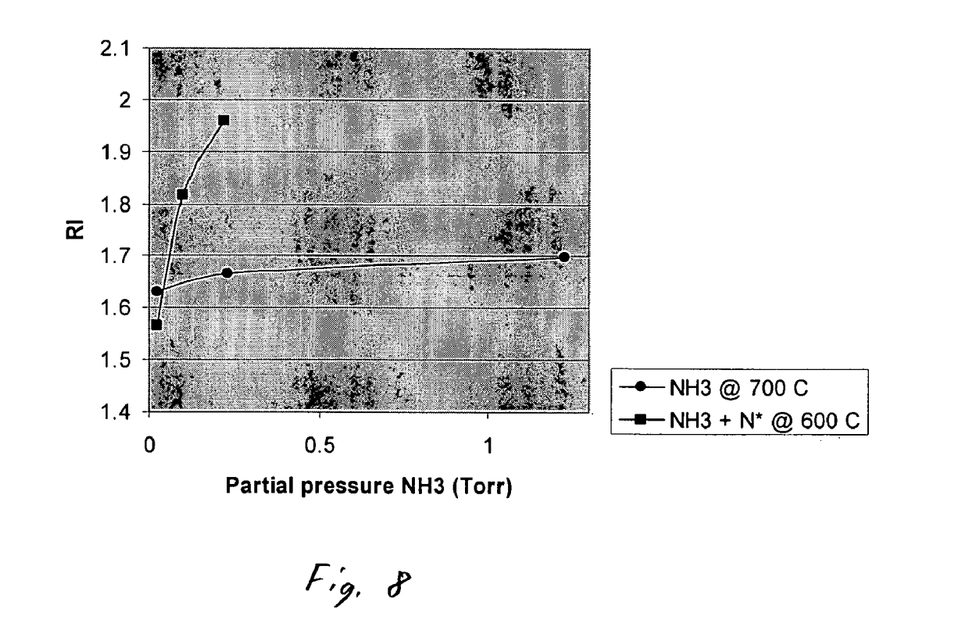
FIG. 8 is a graph showing, through measurement of the index of refraction, the incorporation of nitrogen into a deposited high k layer, in accordance with preferred embodiments of the invention.

The refractive index (RI) of the resulting nitrogen incorporating films were determined. With reference to FIG. 8, the addition of excited nitrogen species was found to significantly enhance the concentration of incorporated nitrogen, even at a lower temperature than the thermal nitridation. For example, while having a lower RI at an ammonia partial pressure of about 0.05 Torr, the RI for the excited nitrogen species/ammonia deposition at an ammonia partial pressure of about 0.175 Torr surpassed the RI for the ammonia-only deposition at a partial pressure of about 0.25 Torr. As also seen in FIG. 8, the RI for the excited nitrogen species/ammonia nitridations remain above the RI for the ammonia-only nitridations throughout the remainder of the tests. Moreover, the RI increased at a greater rate, per increase in ammonia partial pressure, for the excited nitrogen species/ammonia than for the ammonia-only nitridations. Moreover, in experiments not illustrated in FIG. 8, only excited nitrogen species were used to nitride the HfSiO layer. Compared to those experiments, the RI increase was also found to be greater when performing nitridations using the excited nitrogen species/ammonia.

Thus, as noted above, nitridation of materials according to the preferred embodiments offers numerous advantages. For example, a nitridation incorporation which is comparable to thermal nitridation and which is significantly greater than plasma-only nitridation can be achieved. Preferably, the nitrogen incorporation, the atomic percentage of nitrogen in the nitride material is about 5% or greater, more preferably, about 10% or greater and, more preferably, about 15% or greater. Moreover, the nitridation temperature is less than for typical thermal nitridations, reducing thermal budgets and minimizing unwanted reactions of underlying materials. Preferably, nitridations according to the preferred embodiments are performed at about 650° C. or less and, more preferably, at about 600° C. or less. In addition, as discussed above, plasma damage is advantageously prevented by the use of the remotely generated excited species. Moreover, deposition rates of nitrogen compound films can be increased using the combination of the nitrogen precursor, preferably ammonia, and an excited species, preferably nitrogen radicals or metastable nitrogen species.

It will be appreciated that various modifications of the illustrated and discussed embodiments are possible. For example, as noted above, various materials can be nitrided, including high k dielectrics other than HfSiO, including $HfO_2$, $ZrO_2$, ZrSiO, HfAlO, etc. Examples of other materials include silicon and silicon oxide, which can also be used to form gate dielectrics. Advantageously, a silicon surface can be nitrided to form a silicon nitride dielectric layer. Moreover, while illustrated with nitrogen added to already-deposited layers, nitrogen incorporation can also involve chemical vapor deposition of nitrogen-containing layers in which the nitrogen species and other reactants are simultaneously flowed into a chamber, thereby depositing a compound layer.

Accordingly, it will be appreciated by those skilled in the art that various omissions, additions and modifications can be made to the processes described above without departing from the scope of the invention, and all such modifications and changes are intended to fall within the scope of the invention, as defined by the appended claims.

We claim:

1. A method for semiconductor processing, comprising:
    providing a single substrate reaction chamber in gas communication with a source of $NH_3$ and in gas communication with an excited species generator;
    providing a semiconductor substrate in the reaction chamber;
    generating an excited species in the excited species generator;
    exposing the $NH_3$ to the excited species upstream of the substrate and downstream of the excited species generator;
    exposing the substrate to the $NH_3$ and the excited species after exposing the $NH_3$ to the excited species; and
    providing energy from the substrate to locally generate radicals from the $NH_3$ and the excited species near the substrate.

2. The method of claim 1, wherein precursor for the excited species is $N_2$.

3. The method of claim 2, wherein precursor for the excited species further comprises one or more species chosen from the group consisting of He and Ar.

4. The method of claim 1, wherein precursor for the excited species is one or more species chosen from the group consisting of He and Ar.

5. The method of claim 1, wherein exposing the NH₃ to the excited species comprises merging a flow of the excited species and a flow of the NH₃ to form a merged flow of NH₃ and excited species to the substrate.

6. The method of claim 5, wherein merging the flow comprises flowing the excited species and the NH₃ into the chamber via separate inlets, wherein the flow of the excited species and the flow of the NH₃ converge inside the chamber upstream of the substrate.

7. The method of claim 1, wherein exposing the NH₃ to the excited species activates the NH₃ to produce nitrogen radicals.

8. The method of claim 7, wherein generating the excited species produces radicals, wherein exposing the NH₃ to the excited species produces an increase in a total number of radicals relative to an amount of radicals produced after generating the excited species.

9. The method of claim 1, wherein exposing the substrate comprises nitriding the substrate.

10. The method of claim 9, wherein a surface of the substrate comprises a dielectric layer, wherein nitriding the substrate comprises nitriding the dielectric layer.

11. The method of claim 10, wherein the dielectric layer comprises SiO₂.

12. The method of claim 10, wherein the dielectric layer comprises a high k dielectric.

13. The method of claim 12, wherein the high k dielectric is a metal silicate.

14. The method of claim 13, wherein the metal silicate is HfSiO.

15. The method of claim 12, wherein the high k dielectric is HfAlO.

16. The method of claim 10, wherein nitriding the dielectric layer forms a gate dielectric layer for a transistor.

17. The method of claim 9, wherein nitriding the substrate forms a dielectric layer.

18. The method of claim 17, wherein nitriding the substrate forms a silicon nitride.

19. The method of claim 9, further comprising annealing the substrate after nitriding the substrate.

20. The method of claim 19, wherein annealing the substrate comprises exposing the substrate to an elevated temperature in an inert atmosphere.

21. The method of claim 20, wherein the inert atmosphere comprises nitrogen gas.

22. The method of claim 20, wherein the elevated temperature is about 800° C. or less.

23. The method of claim 22, wherein the elevated temperature is about 700° C. or less.

24. The method of claim 19, wherein annealing the substrate is performed for about 1-2 minutes.

25. The method of claim 1, further comprising exposing the substrate to a flow of an other precursor species simultaneous with exposing the substrate to the NH₃ and the excited species, thereby forming a compound film.

26. The method of claim 25, wherein the other precursor species is a silicon precursor.

27. The method of claim 26, wherein the silicon precursor is a silane.

28. The method of claim 26, wherein the silane is SiH₄.

29. The method of claim 1, further comprising exposing the substrate to a flow of an other precursor species and removing the other precursor species from the reaction chamber before exposing the substrate to the NH₃ and the excited species.

30. The method of claim 29, wherein the other precursor species comprises trisilane.

31. The method of claim 1, wherein generating the excited species comprises exposing the excited species precursor to microwave energy in a microwave radical generator disposed upstream of the reaction chamber.

32. The method of claim 1, wherein reaction chamber is a laminar flow reaction chamber.

33. The method of claim 1, wherein forming the merged flow is performed in the reaction chamber.

34. The method of claim 1, wherein exposing the substrate is performed at about 650° C. or less.

35. The method of claim 34, wherein exposing the substrate is performed at about 600° C. or less.

36. A method of nitriding a dielectric layer comprising:
providing the a partially fabricated integrated circuit having a dielectric layer in a reaction chamber;
providing a source of excited nitrogen species outside of the reaction chamber;
flowing the excited nitrogen species into the reaction chamber;
flowing ammonia to the reaction chamber separately from the excited nitrogen species;
exposing the ammonia to the excited nitrogen species; and
subsequently nitriding the dielectric layer by exposing the dielectric layer to the excited nitrogen species and ammonia, wherein a nitrogen incorporation is greater than about 5%.

37. The method of claim 36, wherein nitrogen incorporation is greater than about 10%.

38. The method of claim 37, wherein nitrogen incorporation is greater than about 15%.

39. The method of claim 36, wherein nitriding the substrate is performed at about 600° C. or less.

40. The method of claim 36, wherein the excited nitrogen species comprises nitrogen radicals.

41. The method of claim 36, wherein the reaction chamber is a single substrate reaction chamber.

42. The method of claim 36, wherein nitriding the substrate comprises nitriding a dielectric layer.

43. A method for semiconductor processing, comprising:
generating an excited species outside a reaction chamber;
providing a flow of ammonia to the reaction chamber, the flow separate from the excited species;
generating nitrogen radicals in a reaction chamber by exposing ammonia to the excited species; and
nitriding a gate dielectric layer by exposing the gate dielectric layer to the nitrogen radicals.

44. The method of claim 43, wherein generating nitrogen radicals comprises separately flowing the excited species and the ammonia into the reaction chamber.

45. The method of claim 43, further comprising forming a gate electrode over the gate dielectric layer.

46. The method of claim 43, further comprising chemical vapor depositing a compound film on a substrate by exposing the substrate to the nitrogen radicals and an other precursor.

47. The method of claim 46, wherein the other precursor is a silane and the film is a silicon nitride film.

48. The method of claim 43, wherein the generating the excited species comprises flowing a gas through a radical generator.

49. The method of claim 47, wherein the radical generator is a microwave radical generator.

50. The method of claim 47, wherein the gas is selected from the group consisting of nitrogen gas, helium gas and argon gas.

51. The method of claim 43, wherein the reaction chamber is a cold wall, single substrate reaction chamber.

* * * * *

UNITED STATES PATENT AND TRADEMARK OFFICE
CERTIFICATE OF CORRECTION

PATENT NO. : 7,629,270 B2  Page 1 of 1
APPLICATION NO. : 11/212503
DATED : December 8, 2009
INVENTOR(S) : Swerts et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 931 days.

Signed and Sealed this

Second Day of November, 2010

David J. Kappos
*Director of the United States Patent and Trademark Office*